United States Patent

Schulz et al.

[11] Patent Number: 5,549,975
[45] Date of Patent: Aug. 27, 1996

[54] COATED TOOL AND CUTTING PROCESS

[75] Inventors: Hans Schulz, Balzers, Liechtenstein; Josef Maushart, Solothurn, Switzerland

[73] Assignee: Balzers Aktiengesellschaft, Balzers, Liechtenstein

[21] Appl. No.: 278,011

[22] Filed: Jul. 20, 1994

[30] Foreign Application Priority Data

Jul. 29, 1993 [CH] Switzerland ............ 02 290/93

[51] Int. Cl.[6] ........................................ B22F 7/04
[52] U.S. Cl. .................... 428/553; 428/546; 428/548; 428/551; 428/552
[58] Field of Search ................... 428/546, 548, 428/551, 552, 553, 540, 547, 549, 550

[56] References Cited

U.S. PATENT DOCUMENTS

| | | | |
|---|---|---|---|
| 4,447,263 | 5/1984 | Sugizawa et al. | 75/233 |
| 4,752,535 | 6/1988 | Kvernes | 428/547 |
| 4,781,989 | 11/1988 | Yoshimura et al. | 428/552 |
| 5,071,693 | 12/1991 | Sue et al. | 428/217 |
| 5,228,812 | 7/1993 | Noguchi | 408/144 |
| 5,376,444 | 12/1994 | Grotepass et al. | 428/336 |
| 5,462,901 | 10/1995 | Egami et al. | 501/87 |
| 5,478,634 | 12/1995 | Setoyama et al. | 428/216 |

Primary Examiner—Charles T. Jordan
Assistant Examiner—John N. Greaves
Attorney, Agent, or Firm—Notaro & Michalos PC

[57] ABSTRACT

A coated tool consisting of a cermet body and a refining layer thereon. The refining layer is a wear resistant layer of (Ti, Me) N, wherein Me is at least one metal which forms a stable oxide at a temperature above 700° C.

4 Claims, 1 Drawing Sheet

COATED TOOL AND CUTTING PROCESS

TECHNICAL FIELD

The present invention is directed to a coated tool and especially to a coated cutting tool, the body or substrate thereof being made of a cermet which is covered by a refining coating at least at its working area.

It is further directed to a method of cut-machining a workpiece.

BACKGROUND OF THE INVENTION

Cermets are powder metallurgical materials with hard material component and a binding component. Customarily the predominant hard material component consists of a titanium compound, as e.g. of TiN, TiC, Ti(C,N). As binding component it is customary to use Ni, often alloyed with Co. Other elements which are frequently added to cermets are Mo and Ta.

It is customary to use cermet tools without any coating, this in difference to traditional hard metal tools on the basis of WC, which are coated with a refining coating acting as wear resistant coating.

From the EP-A-0 149 024 according to U.S. Pat. No. 4,693,944 it is, nevertheless, known to refine cermet tools with a TiC, TiN, TiCN, TiCO, TiNO or TiCNO coating, from the EP-A-0 269 525 according to U.S. Pat. No. 4,902,395 with a refinement coating of TiC, TiN or TiCN or of a mixture of these materials.

Finally, it is known from the EP-A-0 440 157 to provide on cermet tools a TiN refining layer.

Although the said refining layers, which are used on cermet tools rather seldom, have been said to be wear reducing layers, such an effect of such layers is not generally approved. Therefore, they may not be mentioned as strictly wear resistant coatings. This because by applying such layers only a protection of the cermet binding component against premature wear is reached, but not an improvement of wear characteristics of the cermet hard material component. This is especially true at high temperatures as do occur when such cermet tools, and especially such cermet cutting tools, are used in practice. Such cutting tools of cermets are normally used without cooling emulsion and are typically used for high cutting speed, so e.g. for finishing operations.

The wear resistance of cermet materials could be improved by lowering the content of binding material component. This would lead to reduction of toughness of such cermet material.

With respect to possible compositions of cermet material, attention is drawn to the said three references which shall be integrated part of the present description with respect to examples of possible cermet compositions.

SUMMARY OF THE INVENTION

It is an object of the present invention to provide a coated tool which consists of a cermet body and a refining layer and which has an improved wear resistance compared with prior art cermet tools coated with such a refining layer.

This is achieved by such refining layer being a wear resistant layer of (Ti,Me)N, wherein Me is at least one metal which forms a stable oxide at a temperature above 700° C.

The inventively applied wear protective layer has a wear resistance which is higher than that of the hard material component of the cermet body. Thus, such inventively applied layer does not only protect the binding component of the cermet body against premature wear, but also its hard material component. This is especially true under normal working conditions of such cermet tools, i.e. at high temperatures.

It is a further object of the present invention to provide said inventively coated cermet tool, wherein the metal Me is aluminum.

According to a today's preferred realization form, an inventive wear resistant layer of TiAlN is applied. Thereby, TiAlN is a meta-stable material which forms a stable oxide at temperatures above 700° C. according to the normal working conditions of cermet tools.

For depositing the layer or coating on the inventive cermet tool and especially of the preferred TiAlN, practically only plasma deposition processes are suited, be it so-called plasma enhanced chemical vapor deposition or reactive physical vapor deposition methods, as e.g. reactive sputtering, reactive evaporation, ion plating.

The plasma used for such deposition processes are preferably DC- or AC-supplied plasma or plasma which are electrically supplied by a hybrid power supply of DC with superimposed AC.

By combining metallical, covalent and ionic binding forces at the inventively applied wear protective coatings, there result extremely good properties of the inventive tool.

It is a further object of the present invention to provide a coated cutting tool consisting of a cermet body and a refining layer, wherein the refining layer is a wear resistant layer of (Ti,Me)N, wherein Me is at least one metal which forms a stable oxide at a temperature above 700° C.

It is further an object of the present invention to provide a milling cutter tool or a turn-over cutting plate or a thread drill or a drill which consists of a cermet body with a refining layer and wherein the refining layer is a wear resistant layer made of (Ti,Me)N, wherein Me is at least one metal which forms a stable oxide at a temperature above 700° C.

It is a further object of the present invention to provide a cutting process for a workpiece which process comprises providing a cutting tool consisting of a cermet body coated with a wear resistant layer of (Ti,Me)N, wherein Me is at least one metal which forms a stable oxide at a temperature above 700° C. and cutting said workpiece without providing a cooling or lubricating liquid to the working area of cutting.

SHORT DESCRIPTION OF THE FIGURES

The present invention will be better understood and objects other than those set forth above will become apparent when consideration is given to the following detailed description thereof.

Such description makes reference to the annexed drawings, wherein.

DETAILED DESCRIPTION OF THE INVENTION

Figure 1:
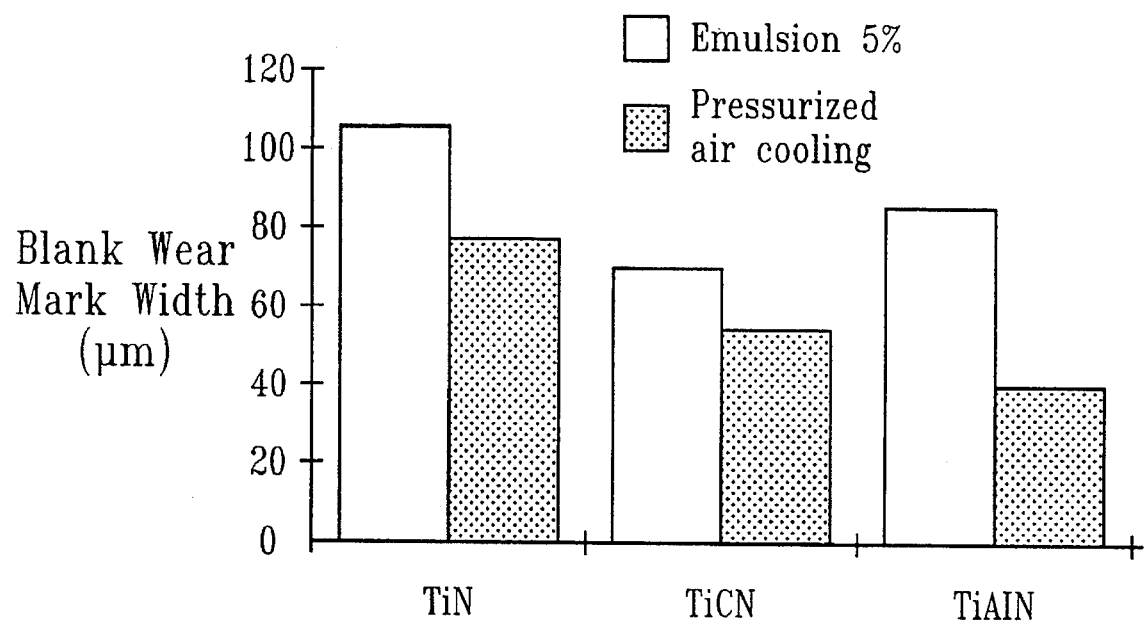
FIG. 1 shows a comparison of efficiency of differently coated end mills of cemented carbide with and without applying a cooling emulsion during milling operation.

Cemented carbide end mills were respectively coated with TiN, TiCN and TiAlN. As cemented carbide bulk material there was used smallest grain steel, K10 with 6% Co, rest of WC. The thickness of the applied coating or layer was 3.0 µm.

Coating process:

All tools were first cleaned by the following procedure:

1. Washing with alcalyne cleaner;
2. rinsing with deionized water;
3. drying.

Then, the tools were deposited in a holder and introduced to a coating plant. The coating process was performed as follows:

1. Evacuating the process chamber;
2. heating up the tools;
3. ion etching the tools;
4. coating the tools;
5. cooling the tools.

The steps 1 to 3 and 5 of the coating process were performed identically for all the tools and are described commonly for all tools.

After the vacuum chamber is closed, a vacuum is installed with a pressure of $2 \cdot 10^{-5}$ mbar.

Then, there is installed in the chamber an argon pressure of $25 \cdot 10^{-4}$ mbar and there is ignited a plasma discharge between a filament as a cathode and the tools. The tools are thereby heated up by electron bombardment. The heating process is terminated as soon as the tools reach a temperature of 450° C.

In the next process step, the argon pressure is reduced to $15 \cdot 10^{-4}$ mbar and a discharge is ignited between the filament and an anode. From the plasma thus ignited argon ions are extracted and are accelerated towards and on the tools which are operated on an electric potential which is negative with respect to plasma potential. The argon ions sputter off the uppermost atomic layer of the tool surface, so that an oxygen-free surface is achieved which is a condition for subsequent applying a layer with good adhesion.

Deposition of the binary layers TiN and TiCN is realized by evaporation, deposition of the ternary layers by a combination of evaporation and sputtering.

For evaporation there is ignited a plasma discharge between a crucible as an anode and a filament. The argon pressure is set according to the pressure mentioned above for clean etching. The plasma discharge is used for melting the titanium in the crucible and for ionizing the metal vapor. The ionized metal vapor is accelerated towards and on the tools by operating the tools on an electrical potential which is negative with respect to plasma potential.

For deposition of TiN-layers, shortly after starting evaporation of titanium, nitrogen is introduced with a partial pressure of $4 \cdot 10^{-4}$ mbar into the processing chamber. At this pressure there is formed a stochiometric TiN-layer on the tools.

For deposition of the TiCN-layer shortly after beginning of evaporation, as is done by depositing the TiN-layer, nitrogen is introduced with a partial pressure of $4 \cdot 10^{-4}$ mbar into the process chamber. After about one third of the desired layer thickness of 3 µm is deposited, a carbon containing gas, preferably acetylen, is introduced with a steadily rising rate versus time. Thereby, a TiCN-layer is formed with a continuous change of nitrogen to carbon content ratio.

The deposition of TiAlN is done by combining an evaporation and a sputtering process. The process initial phase accords with the deposition of TiN. After a layer of approx. 0.2 µm of TiN has been deposited, there is started parallel to the evaporation process a sputtering process by which a target made of titanium and aluminum is sputtered. By rising the argon pressure on $30 \cdot 10^{-4}$ mbar the evaporation rate of titanium from the crucible is significantly reduced so that the composition of the layer becomes approximately equal to the composition of the target material. As for the TiN-deposition, the partial pressure of nitrogen is $4 \cdot 10^{-4}$ mbar.

After the desired thickness of 3 µm of the layer is reached, the processes are stopped by switching off the respective electric power supplies.

The tools are then cooled down to a temperature of 150° C. in vacuum, then the process chamber is flooded and the tools are removed from the process chamber.

With the cemented carbide end mills differently coated as was described, the alloy 1.7225 (42CrMo$_4$) which had been tempered to a strength Rm=900N/mm$^2$ was machined. The cutting parameters were:

| cutting speed: | v: 200 m/min |
| feed per tooth: | $f_z$: 0.05 mm |
| radial depth of cut: | ae: 0.5 mm |
| axial depth of cut: | ap: 12 mm |

All end mills had a diameter of 12 mm.

FIG. 1 shows the result by means of blank wear marks.

Cutting was performed with and without cooling emulsion. Whereas with the use of cooling emulsion the TiCN-coated cemented carbide end mills showed the best results, for dry cutting the TiAlN-coated cemented carbide tools had far the lowest wear.

According to the present invention, these results were exploited for tools which are typically operated without cooling emulsion, namely for tools witch a cermet body.

Thus, end mills with a body of a cermet material with the following composition: 85% TiCN, 5% Mo$_2$C, 10% CNi, Co were coated with TiN, TiCN or TiAlN at the same coating process conditions which were described above and with the same layer thickness.

Figure 2:
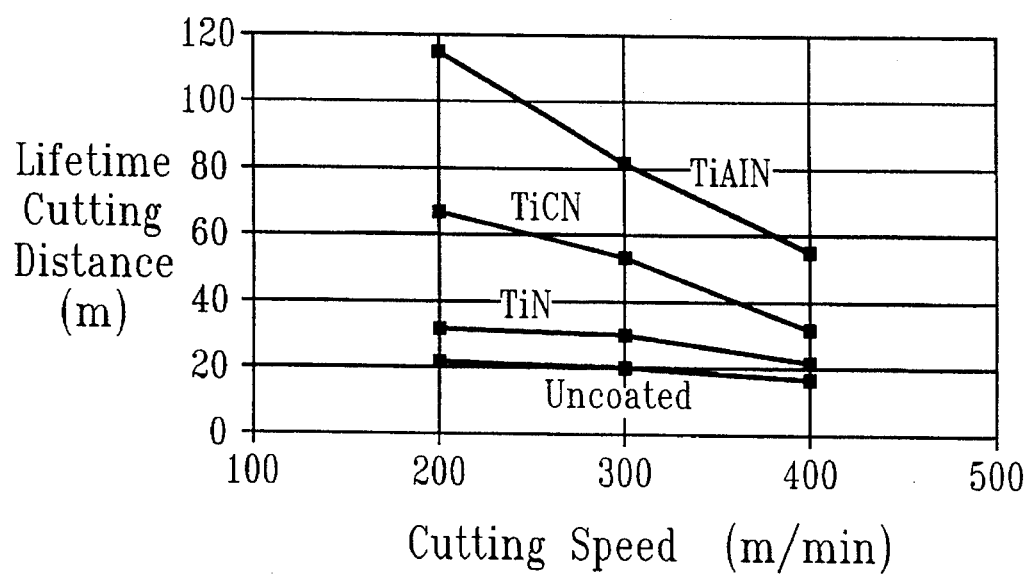
FIG. 2 shows the tool life distances of uncoated, coated and especially of an inventively coated cermet-based end mills as a function of cutting speed.

In FIG. 2 the dependency of the lifetime distance of the tools, as a function of the cutting speed, is shown for the TiN-, TiCN- and TiAlN-coated cermet end mills and, additionally, of uncoated cermet end mills. Again, the alloy 1.7225 (42CrMo$_4$) was machined, tempered to a toughness of Rm=900N/mm$^2$.

The cutting parameters were:

| radial depth of cut: | ae: 0.5 mm |
| axial depth of cut: | ap: 12 mm |
| feed per tooth: | $f_z$: 0.045 mm |

All the cermet body end mills had a diameter of 12 mm.

As a criterium for lifetime, in each case reaching of the average blank wear mark width of 100 µm or of the maximum blank wear mark width of 150 µm was taken at the cutting etch or of a maximum blank wear mark width of 200 µm at the corners. The TiAlN-coated cermet body tools showed far the best results.

The inventively coated tools may be especially cutting tools, especially milling tools, turnover cutting plates and possibly thread drills or even drills.

Especially under the aspect of pollution, and thus under ecological aspects, it must be emphasized that with the inventive tools, and especially with the preferred TiAlN-coated cermet tools, efficient machining becomes possible without the use of cooling lubrication.

What is claimed:

1. A coated tool consisting of a cermet body and a refining layer thereon, whereby the refining layer is a wear resistant layer of (Ti,Me)N, wherein Me is at least one metal which forms a stable oxide at a temperature above 700° C.

2. The tool according to claim 1, wherein said at least one metal is aluminum.

3. The tool according to claim 1 being a cutting tool.

4. The tool according to claim 1 being one of a milling tool, a turnover cutting plate, a thread drill and a drill.

* * * * *